(12) United States Patent
Chen et al.

(10) Patent No.: US 8,513,790 B2
(45) Date of Patent: Aug. 20, 2013

(54) PACKAGE-BASE STRUCTURE OF LUMINESCENT DIODE

(75) Inventors: Chih-Ming Chen, Hsinchu (TW); Deng-Huei Hwang, Taipei (TW); Ching-Chi Cheng, Hsinchu (TW)

(73) Assignee: Silicon Base Development Inc., Hsinchu (TW)

( * ) Notice: Subject to any disclaimer, the term of this patent is extended or adjusted under 35 U.S.C. 154(b) by 614 days.

(21) Appl. No.: 12/428,342

(22) Filed: Apr. 22, 2009

(65) Prior Publication Data

US 2009/0261375 A1    Oct. 22, 2009

(30) Foreign Application Priority Data

Apr. 22, 2008 (TW) ................................ 97114723 A

(51) Int. Cl.
*H01L 33/00* (2010.01)
(52) U.S. Cl.
USPC ............ 257/678; 257/773; 257/774; 257/730
(58) Field of Classification Search
USPC ............ 257/99, E33.056, 678, 701, 773–774, 257/730
See application file for complete search history.

(56) References Cited

U.S. PATENT DOCUMENTS

| | | | |
|---|---|---|---|
| 3,640,806 A | 2/1972 | Watanabe et al. | |
| 3,962,052 A | 6/1976 | Abbas | |
| 6,443,597 B1 | 9/2002 | Natori | |
| 6,953,952 B2 | 10/2005 | Asakawa | |
| 2003/0160327 A1* | 8/2003 | Usui et al. | 257/758 |
| 2004/0075100 A1 | 4/2004 | Bogner | |
| 2005/0205974 A1 | 9/2005 | Su | |
| 2006/0023451 A1 | 2/2006 | Han | |
| 2006/0055050 A1* | 3/2006 | Numata et al. | 257/774 |
| 2008/0017962 A1* | 1/2008 | Lin | 257/678 |

\* cited by examiner

*Primary Examiner* — Tran Tran
(74) *Attorney, Agent, or Firm* — Kirton McConkie; Evan R. Witt

(57) ABSTRACT

A package-base structure of a luminescent diode and its fabricating process. The package-base structure includes a substrate having thereon a holding space; an insulating layer extending from a bottom surface of the holding space to the bottom of the substrate; an through hole defined in the insulating layer; and a conductive layer disposed over the insulating layer. The insulating layer decouples the current flow and heat flow to increase the lifetime of the package-base structure together with the luminescent diode. In the fabricating process, the insulating layer is formed by anodic etching to allow the insulating layer have a porous structure.

13 Claims, 9 Drawing Sheets

PACKAGE-BASE STRUCTURE OF LUMINESCENT DIODE

FIELD OF THE INVENTION

The present invention relates to a package base of a luminescent diode, and more particularly to a package base having separate current flow pathway and heat flow pathway. The present invention also relates to a process of fabricating such package base.

BACKGROUND OF THE INVENTION

Luminescent diode is a semiconductor diode capable of emitting light and serving as a light source. Light-emitting diode (LED) and laser diode are typical examples of luminescent diodes. The advantages of luminescent diodes over traditional light sources include lower energy consumption, longer lifetime, improved robustness, smaller size and faster switching.

Luminescent diode is usually packaged before being incorporated into a circuit. Please refer to FIG. 1, a cross-sectional view illustrating a conventional LED package. The LED package 10 includes a heat-dissipating substrate 102, a conductive layer 103, an insulating layer 104, a package base 105 and a conducting structure 106. The package base 105 is mounted on the insulating layer 104 and has a holding space 1051 supporting a LED chip 101. The conductive layer 103 serves as a positive electrode 1031 and a negative electrode 1031, separated by the insulating layer 104. The conducting structure 106 is formed through the package base 105 and the insulating layer 104 so as to be electrically connected to the conductive layer 103. By wire-bonding the LED chip 101 to the conducting structure 106 via a wire 107, the LED chip 101 can be electrically connected to the positive electrode 1031 and the negative electrode 1032 and receive electricity via external wires 108. An alternative mounting technology, flip chip procedure, can be applied to electrically connect the LED chip 101 to the conducting structure 106 via solder bumps (not shown).

The heat-dissipating substrate 102 includes a heat conductive layer 1021 and an insulating layer 1022. The insulating layer 1022 is made of heat conductive polymer while the heat conductive layer 1021 is usually made of metal material. The insulating layer 1022 interfaced between the heat conductive layer 1021 and the electrodes 1031 and 1032. Such structure makes the heat generated by the LED chip 101 to be dissipated via the heat-dissipating substrate 102. In addition, some conductive adhesive (denoted by "A") may be applied to an area around the conducting structure 106 between the package base 105 and the conductive layer 103 to firmly fix the package base 105. This increases the area of the heat flow so as to decrease the thermal resistance.

When the LED chip 101 is switched on to emit light, heat is generated along with the light. As shown in FIG. 1, the current flow pathways E and E' and the heat flow pathway H are too close and thus coupled thermal-electrical effect occurs. The couple effect accelerates the oxidization of the conductive layer 103 and degrades the conductive layer 103 to reduce the conductivity thereof. Furthermore, the degraded conductive layer 103 incurs worse heat dissipation and the accumulated heat affects the luminescence efficiency of the LED chip 101. The efficiency loss further generates more heat. This begins a vicious circle to shorten the lifetime of the LED package 10.

Therefore, there is a need of providing an improved package base of a luminescent diode to obviate the drawbacks encountered from the prior art.

SUMMARY OF THE INVENTION

The present invention provides a package base of a luminescent diode having separate current flow pathway and heat flow pathway so as to prevent the couple thermal-electrical effect on the conductive electrodes.

The present invention also provides a fabricating process to manufacture a package base having separate current flow pathway and heat flow pathway.

In accordance with an aspect of the present invention, the package base includes a substrate; a holding space formed on a first surface of the substrate; an insulating layer extending from the holding space to a second surface of the substrate; and a through hole penetrating the insulating layer without touching the substrate. The electrode is coated on the surface of the insulating layer. A first heat conductive layer is disposed between the luminescent and the substrate. A second heat conductive layer is disposed on the second surface of the substrate. The heat flow pathway extending from the first heat conductive layer to the second heat conductive layer is separated from the current flow pathway by the insulating layer.

In an embodiment, the insulating layer includes a porous silicon oxide layer.

In accordance with another aspect of the present invention, the fabricating process includes the following steps. At first, a holding space having a bottom surface is formed on a first surface of a substrate. Then, a first mask layer is formed on the first surface and an inner surface of the holding space and a second mask layer is formed on a second surface of the substrate. The first mask layer and the second mask layer are patterned to define a first opening and a second opening, respectively. The first opening is located in the holding space. The insulating layer is formed by anodically etching the substrate through the first opening and the second opening to form a porous structure extending from the bottom surface of the holding space to the second surface.

In an embodiment, the second opening has a cross-sectional area larger then that of the first opening.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
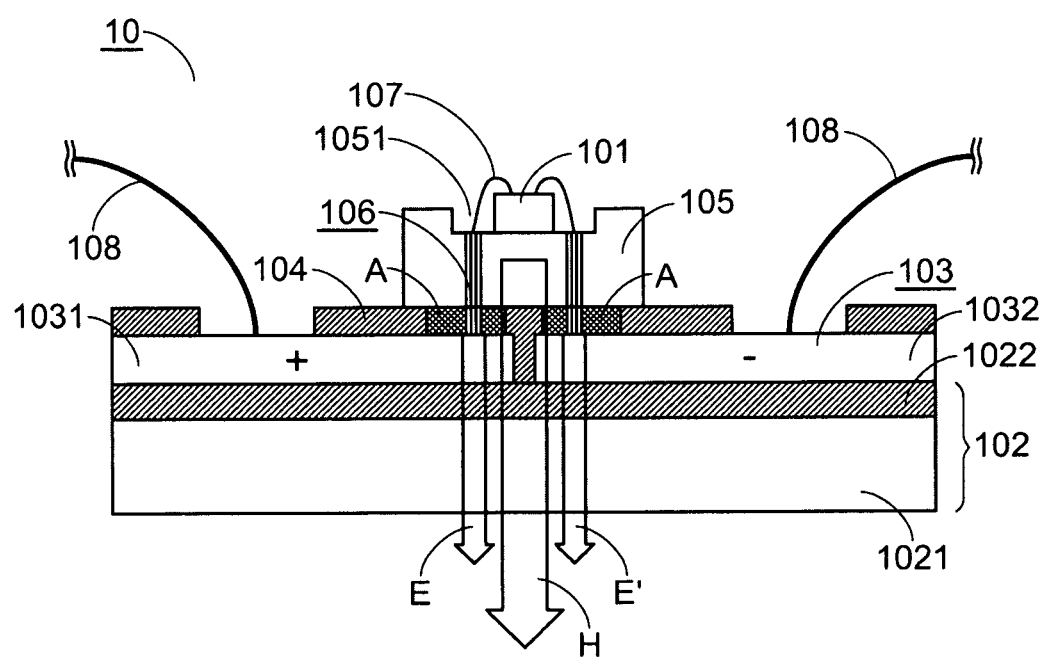
FIG. 1 is a cross-sectional view illustrating a conventional LED package.
Figure 2A:
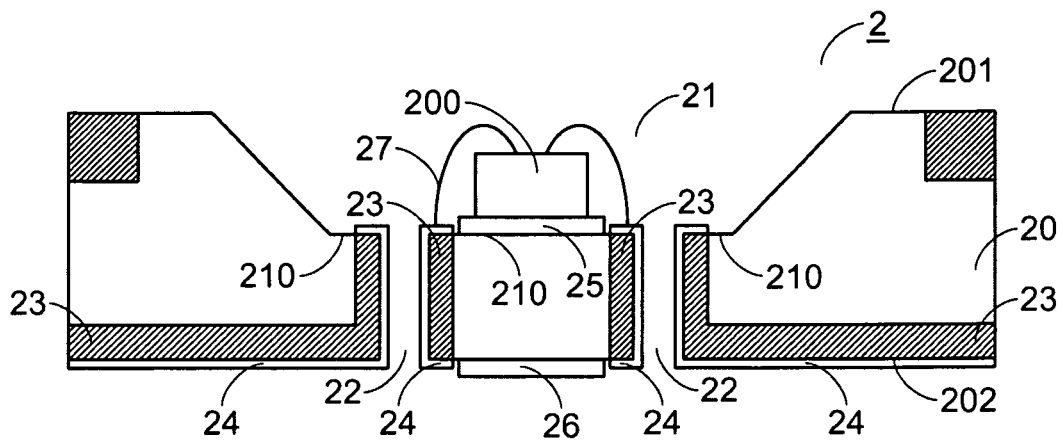
FIG. 2A is a cross-sectional view illustrating a first preferred embodiment of a package base according to the present invention.
Figure 2B:
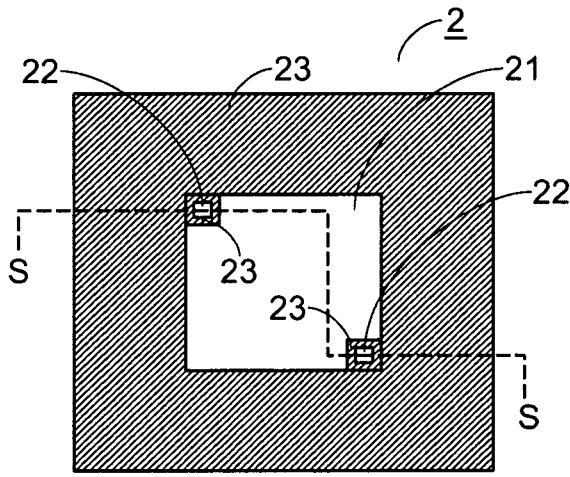
FIG. 2B is a bottom view of the package base of FIG. 2A.

The present invention provides a new package base of a luminescent diode to prevent the coupled thermal-electrical effect. The luminescent diode may be a light-emitting diode (LED), a laser diode, and the like. FIG. 2A is a cross-sectional view illustrating a first preferred embodiment of a package base according to the present invention. The cross-sectional view is obtained along the dashed line S-S in FIG. 2B, a bottom view of the package base 2. Please note that some layers, for example conductive layer, of the package base 2 are omitted in FIG. 2B to clearly show the essential parts to be described, but the layers not shown in FIG. 2B still exist in the package base 2. Please also note that the article "a" or "an" may be used for some elements, but the number of the elements is not limited to "one".

The package base 2 includes a substrate 20, a holding space 21, a through hole 22 and an insulating layer 23. The substrate 20 may be a silicon substrate and has two opposite surfaces 201 and 202 (called first surface 201 and second surface 202 hereinafter). The holding space 21 is a cavity arranged at the first surface 201 and has a flat bottom 210 for supporting the luminescent diode 200. The through hole 22 is formed between the flat bottom 210 and the second surface 202. The insulating layer 23 covers a portion of the second surface 202 and the surface of the through hole 22. In one embodiment, the insulating layer 23 is made of porous silicon oxide and the formation thereof has been described in U.S. Pat. No. 3,640,806 and No. 3,962,052.

A conductive layer 24, made of metal or alloy such as TiW/Cu/Ni/Au, Ti/Cu/Ni/Au, Ti/Au/Ni/Au, AlCu/Ni/Au and AuSn, is formed over the insulating layer 23. By wire bonding, the luminescent diode 200 is electrically connected to the conductive layer 24 via a wire 27. In other embodiment, the luminescent diode 200 may be electrically connected to the conductive layer 24 by flip chip mounting technology. Please note that the arrangement of the positive electrode and the negative electrode varies with the pattern design of the package base and does not described verbosely.

For heat dissipation purpose, a first heat conductive layer is interfaced between the luminescent diode 200 and the substrate 20 to conduct the heat generated by the luminescent diode 200 to the substrate 20. A second heat conductive layer is attached to the second surface 202 of the substrate 20 to conduct heat from the substrate 20 out. The heat conductive layers 25 and 26 are formed of heat conductive material such as aluminum.

Figure 2C:
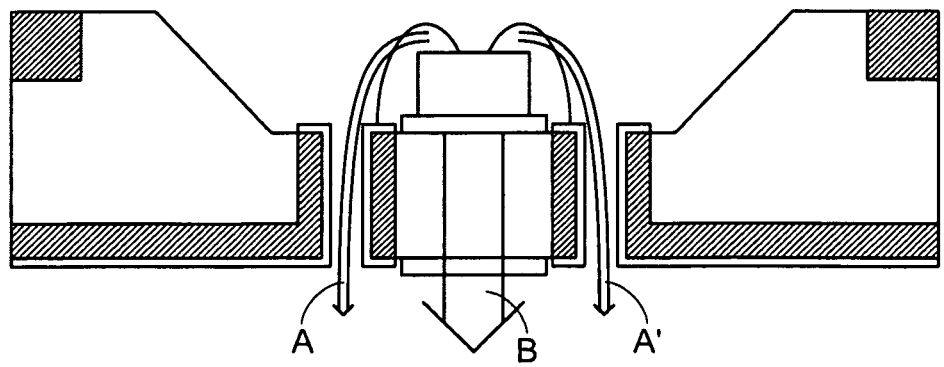
FIG. 2C is the cross-sectional view of the package base of FIG. 2A with marked current flow pathway and heat flow pathway.

To discuss the current flow pathway and the heat flow pathway of the package base according to the present invention, please refer to the package base in FIG. 2C. The current flow pathways A and A' extend along the conductive layer 24 coated inside the through hole 22. The heat flow pathway B extends along a direction from the first heat conductive layer 25 to the second heat conductive layer 26. There is the insulating layer 23 separating the current flow pathways A and A' from the heat flow pathway B. Hence, the coupled thermal-electrical effect is thus greatly eliminated.

Figure 3A:
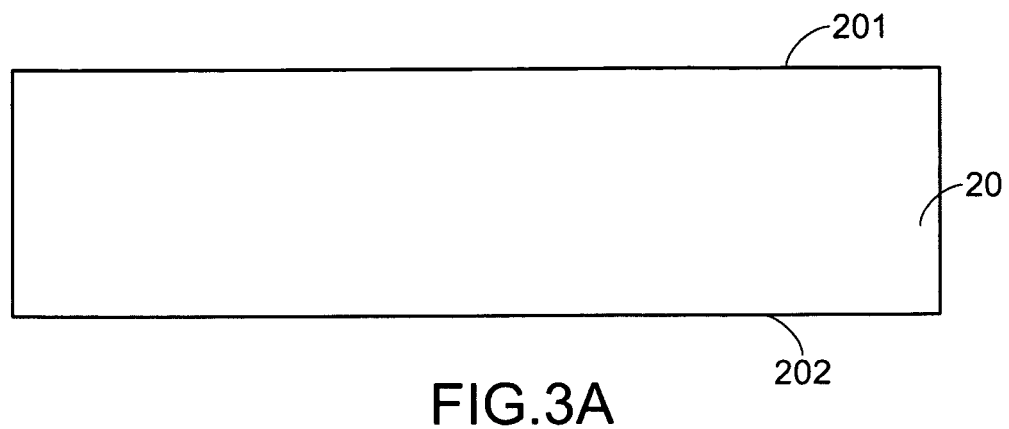
FIGS. 3A~3L are schematic diagrams illustrating the process of fabricating the package base of FIG. 2A according to the present invention.
Figure 3B:
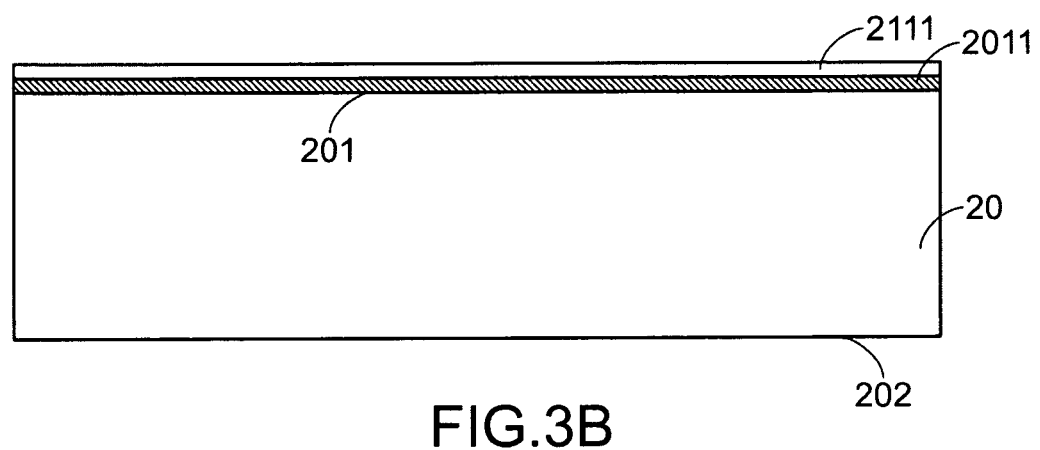
Figure 3C:
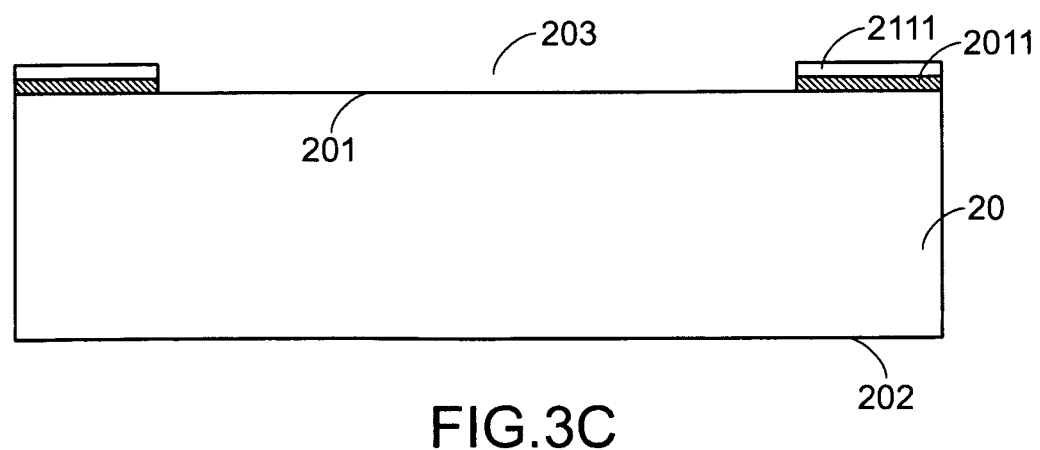
Figure 3D:
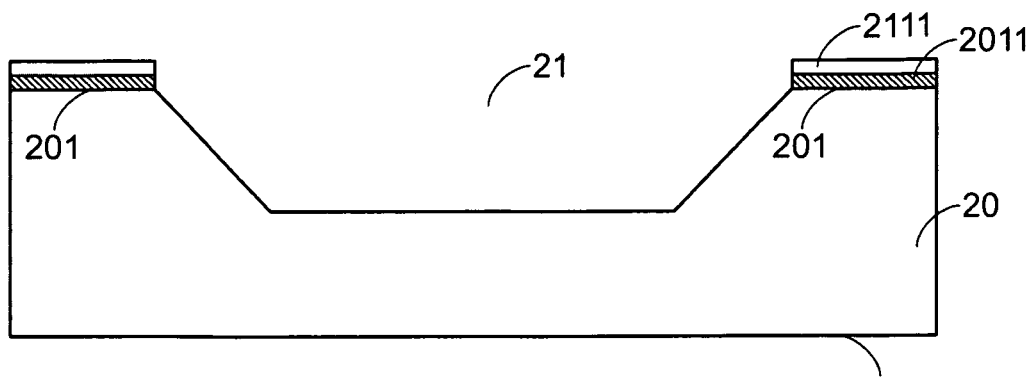
Figure 3E:
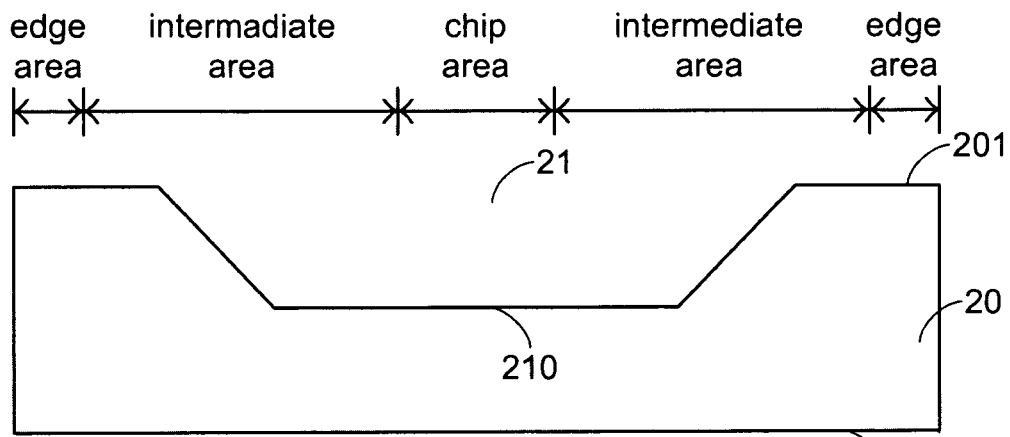

FIG. 3A~3L are schematic diagrams illustrating the process of fabricating such package base of FIG. 2A. At first, a substrate 20, for example silicon substrate, having two opposite surfaces 201 and 202 is provided (FIG. 3A). Then, a mask layer 2011 (made of silicon nitride, silicon oxide or metal) and a photoresist layer 2111 are formed on the first surface 201 of the substrate 20 (FIG. 3B). The mask layer 2011 is patterned by a photolithography and etching procedure to define a first opening 203 (FIG. 3C). Next, an etching procedure is performed to partially etch off the substrate 20 through the first opening 203 to form the holding space 21 having a flat bottom 210 (FIG. 3D). The etching procedure is a wet etching procedure or a reactive ion procedure. After removing the remaining photoresist layer 2111 and mask layer 2011, the resulting structure is shown in FIG. 3E. For clearly illustrating the following steps including etching and ion-implantation, three areas are defined on the substrate 20. They are the chip area for supporting the luminescent diode chip 200, the edge area where the package base 2 will be diced after the fabricating process, and the intermediate area between the two areas.

Figure 3F:
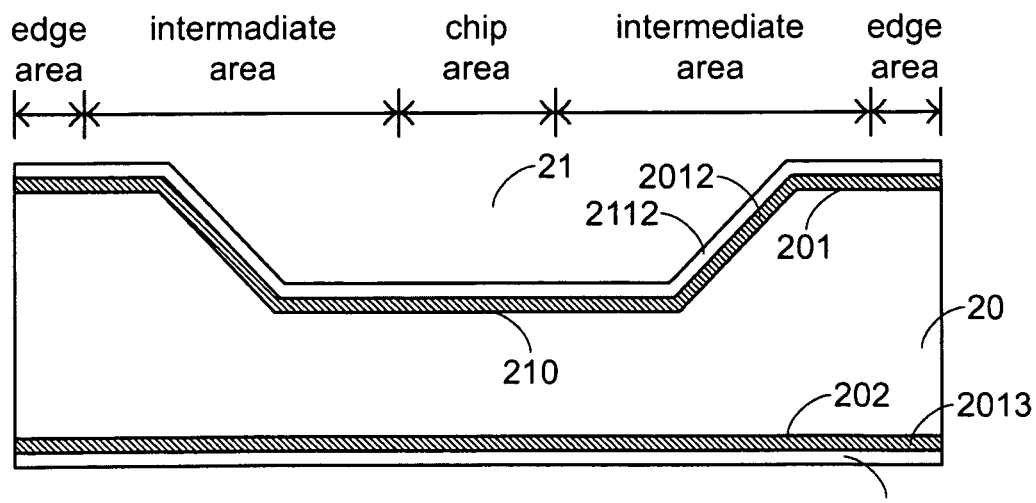
Figure 3G:
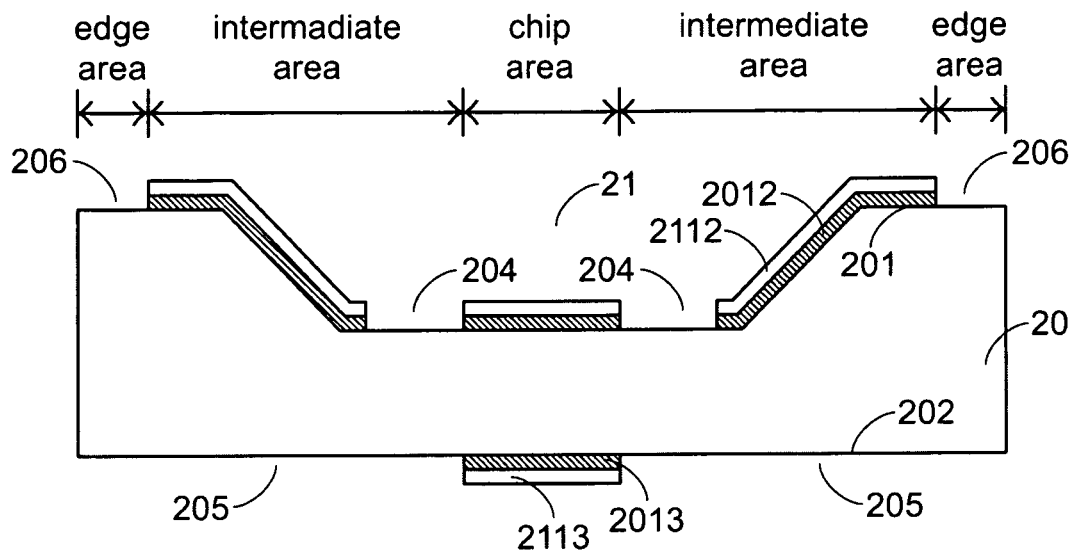
Figure 3H:
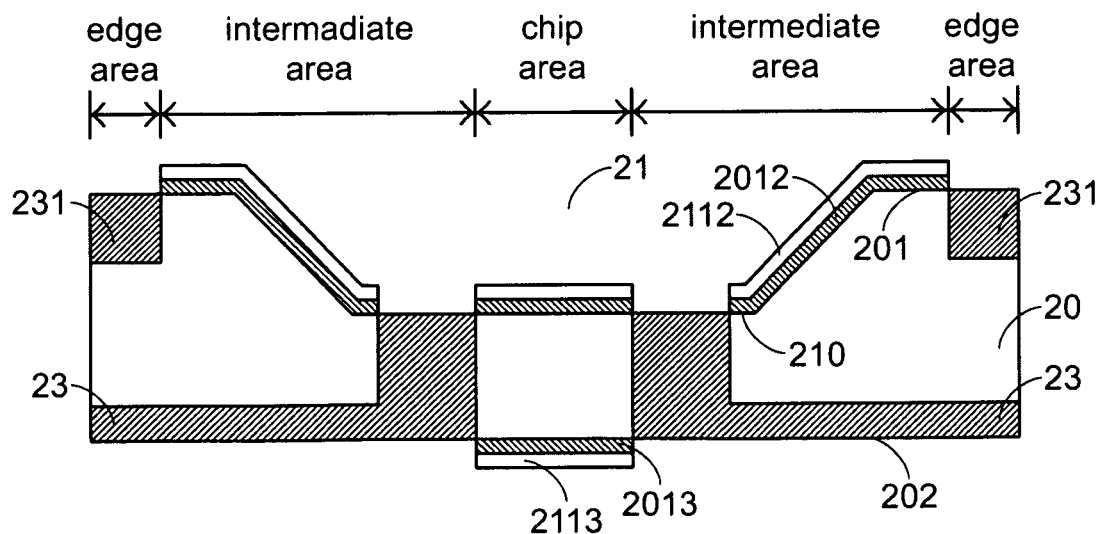

Then, a mask layer 2012 and a photoresist layer 2112 are formed on the first surface 201 and the surface of the holding space 21, while another mask layer 2013 and another photoresist layer 2113 are formed on the second surface 202 (FIG. 3F). The mask layers 2012 and 2013 are patterned by a photolithography and etching procedure to define a second opening 204 and a third opening 205 (FIG. 3G). The second opening 204 is arranged over a portion of the intermediate area while the third opening 205 is arranged over the edge area and the intermediate area. Next, an anodic etching procedure is performed through the second opening 204 and the third opening 205 to form porous silicon oxide, i.e. insulating layer 23 at a certain area of the substrate 20 (FIG. 3H). The isolating layer 23 extends from the flat bottom 210 of the holding space 21 to the second surface 202 of the substrate 20. In this cross-sectional view, it is shown that a L-shaped insulating layer 23 is formed adjacent to the chip area. In an embodiment, the anodic etching step is performed in a HF solution. Another insulating layer 231 may be formed on the first surface 201 in the edge area by defining a fourth opening 206 and anodically etching the substrate 20 through the fourth opening 206. Since the insulating layer 231 whose material is almost porous silicon oxide can be controllably etched by BOE etching, the dicing after the fabrication of the package base becomes easier.

Figure 3I:
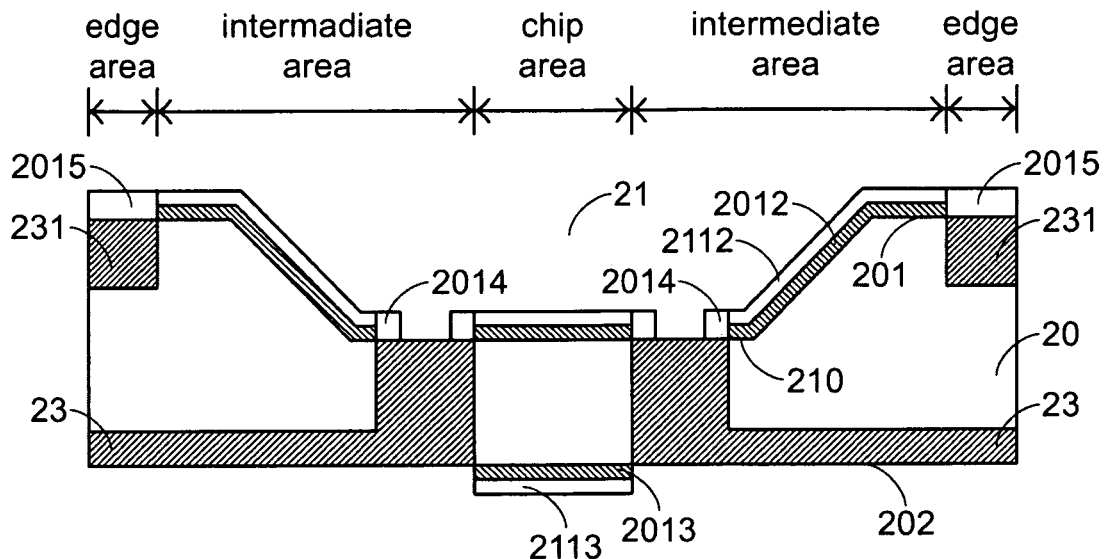
Figure 3J:
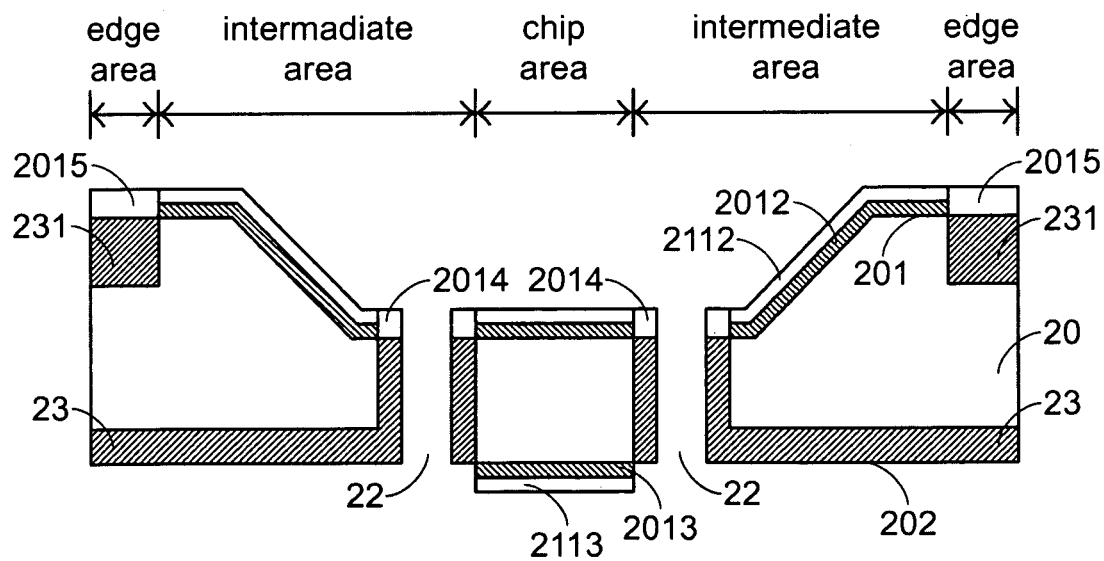
Figure 3K:
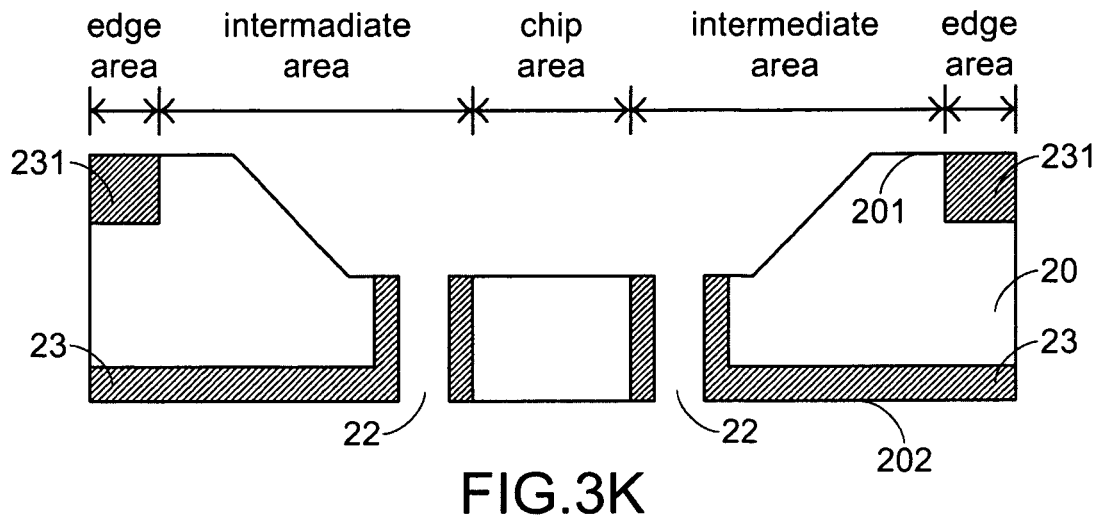

Then, a spacer 2014 is formed on the surface of the second opening 204, and a protective layer 2015 is also formed on the insulating layer 231 to prevent the insulating layer 231 from being etched in the following step (FIG. 3I). After the etching step using the spacer 2014 as the mask, a through hole 22 is formed in the insulating layer 23 and penetrates the substrate 20 (FIG. 3J). After removing the remaining photoresist layers 2112 and 2113, mask layers 2012 and 2013, spacer 2014 and protective layer 2015, the resulting structure is shown in FIG. 3K.

Figure 3L:
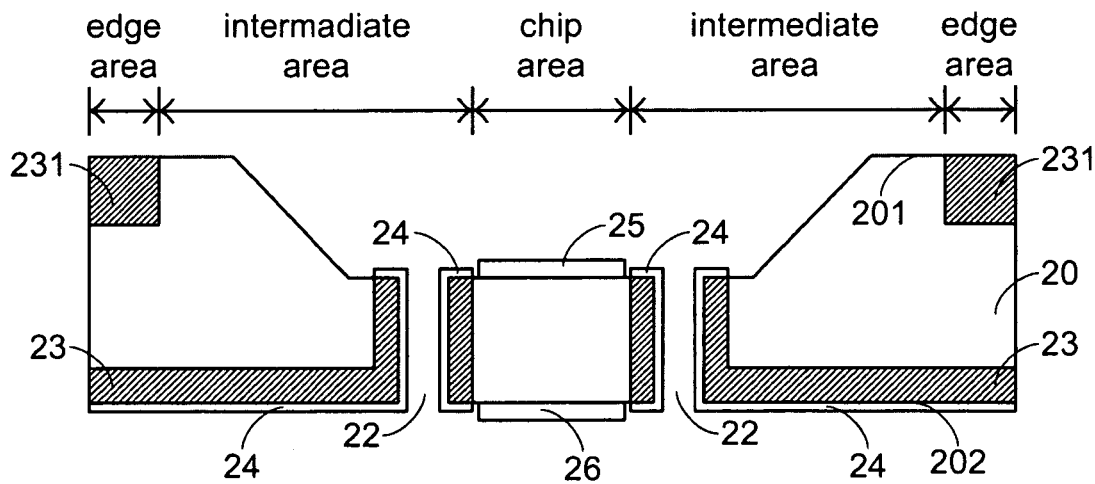

At last, a conductive layer 24 is formed to cover the isolating layer 23. A first heat conductive layer 25 and a second heat conductive layer 26 are formed at the opposite sides of the substrate 20 in the chip area (FIG. 3L). The resulting structure, i.e. the package base, is ready for the mounting of the luminescent diode chip. A luminescent diode chip is electrically connected to the conductive layer 24 to get the structure as shown in FIG. 2A.

Optionally, after the formation of the openings 204, 205 and 206, an impurity may be shallowly introduced through the openings 204, 205 and 206 into the substrate 20 to form low resistivity regions. The impurity is introduced by diffusion or ion implantation. The low resistivity regions have a thickness ranging from 1~10 μm.

Figure 4A:
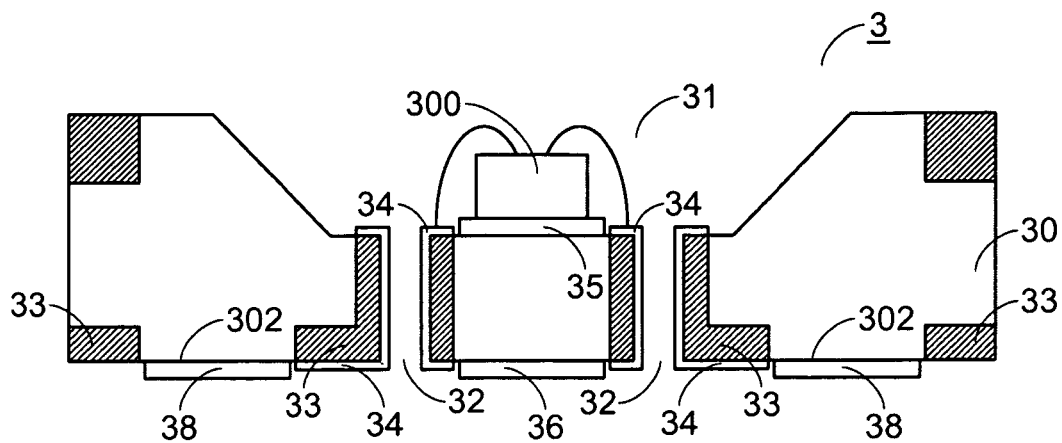
FIG. 4A is a cross-sectional view illustrating a second preferred embodiment of a package base according to the present invention.
Figure 4B:
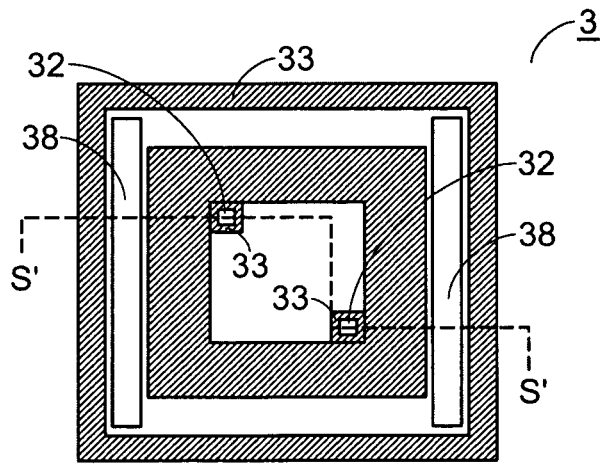
FIG. 4B is a bottom view of the package base of FIG. 4A.

FIG. 4A illustrates a second preferred embodiment of a package base according to the present invention. The cross-sectional view is obtained along the dashed line S'-S' in FIG. 4B, a bottom view of the package base 3. Please note that some layers, for example conductive layer, of the package base 3 are omitted in FIG. 4B to clearly show the essential parts to be described, but the layers not shown in FIG. 4B still exist in the package base 3.

The package base 3 includes a substrate 30, a holding space 31, a through hole 32, an insulating layer 33, a conductive layer 34 and two heat conductive layers 35 and 36, which are similar to those described with reference to FIG. 2A. A further heat conductive layer 38 is formed to provide a further heat flow pathway. The insulating layer 33 in the intermediate area is shortened to provide a space for the heat conductive layer 38. To form such insulating layer 33, the third opening 205 in FIG. 3G defined by the mask layer 2013 is arranged over the edge area and only a portion of the intermediate area. Therefore, after the anodic etching step, the second surface 302 of the substrate 30 in the other portion of the intermediate area is not affected so that the insulating lager 33 does not cover the other portion of the intermediate area. At last, the heat conductive layer 38 is formed together with the second heat conductive layer 36. The other steps of fabricating the package base 3 are similar to those described with reference to FIGS. 3A~3L and do not described verbosely.

Figure 4C:
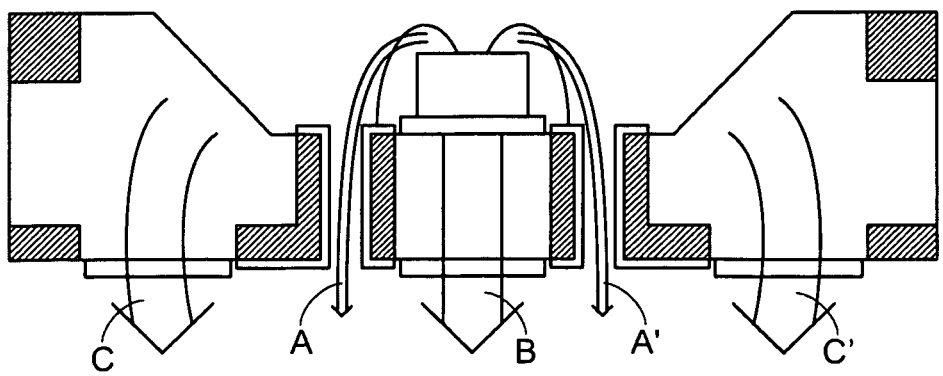
FIG. 4C is the cross-sectional view of the package base of FIG. 4A with marked current flow pathway and heat flow pathway.

FIG. 4C illustrates the current flow pathway and the heat flow pathway of the package base according to the present invention. The current flow pathways A and A' extend along the conductive layer 34 coated inside the through hole 32. The heat flow pathway B extends along a direction from the first heat conductive layer 35 to the second heat conductive layer 36. Another heat flow pathways C and C' extend along a direction from the luminescent diode chip 300 to the heat conductive layer 38 through the intermediate area of the substrate 30. There is the insulating layer 33 separating the current flow pathways A and A' from the heat flow pathways B, C and C'. Hence, the coupled thermal-electrical effect is thus greatly eliminated.

Figure 5A:
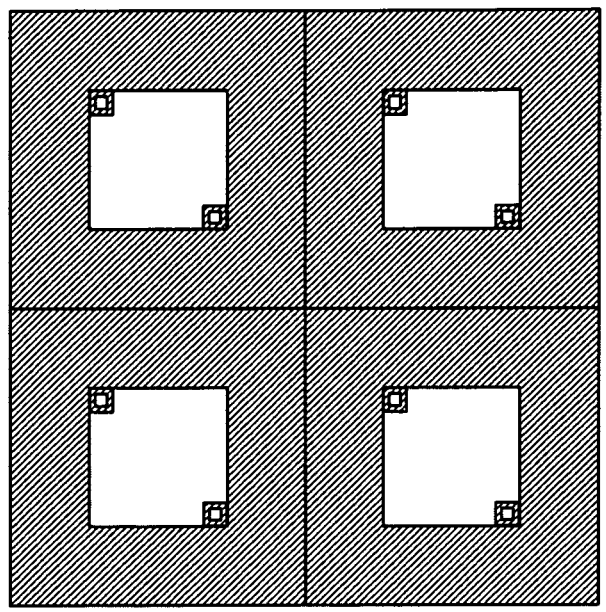
FIGS. 5A and 5B illustrate the layout of the package base of FIG. 2A and FIG. 4A in a wafer.
Figure 5B:
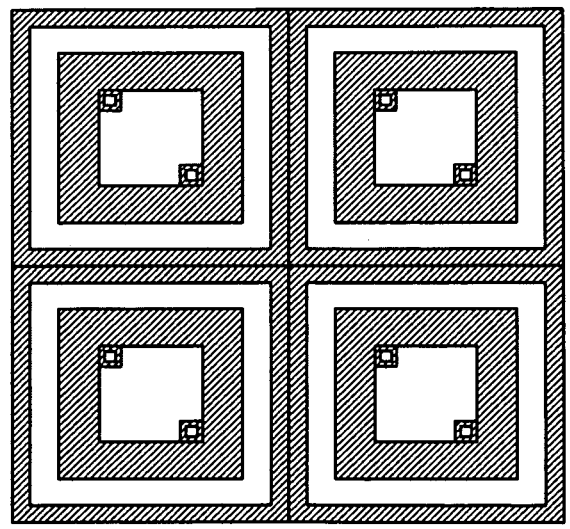

After the fabricating process, there are a plurality of dies formed in the wafer. The layout is arranged as shown in FIG. 5A and FIG. 5B. Although only four dies are shown, in fact, there are hundreds of dies formed in the wafer. The wafer should be diced into unit dies, each of which has the package base structure of FIG. 2A or FIG. 4A. The wafer can be easily cut along the porous silicon by BOE etching.

From the above description, the luminescent diode package base of the present invention has separate current flow pathway and heat flow pathway. An insulating layer is formed between the current flow pathway and the heat flow pathway to prevent the "mixing" of them. Hence, the annoying coupled thermal-electrical effect does not occur so as to ensure the long lifetime of the luminescent diode package.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package base of a luminescent diode, comprising:
   a substrate having a first surface and a second surface opposite to the first surface;
   a holding space formed on the first surface and having a bottom surface for supporting the luminescent diode;
   a porous insulating layer extending from the bottom surface of the holding space to the second surface of the substrate;
   a through hole formed in the porous insulating layer extending from the bottom surface of the holding space to the second surface;
   a porous insulating region disposed at an edge of one selected from the first surface, the second surface and both; and
   a third heat conductive layer formed on the second surface of the substrate between the porous insulating region and the porous insulating layer.

2. The package base according to claim 1 wherein the insulating layer is a porous silicon oxide layer.

3. The package base according to claim 1, further comprising a conductive layer to be electrically connected to the luminescent diode, the conductive layer being arranged over the porous insulating layer.

4. The package base according to claim 3, further comprising:
   a first heat conductive layer disposed between the bottom surface and the luminescent diode for engaging with the luminescent diode to conduct heat generated by the luminescent diode to the substrate; and
   a second heat conductive layer disposed on the second surface of the substrate for engaging with the luminescent diode to conduct the heat in the substrate outwards.

5. The package base according to claim 4, wherein the first heat conductive layer is directly formed on the first surface.

6. The package base according to claim 4, wherein the second heat conductive layer is directly formed on the second surface.

7. The package base according to claim 4, wherein the first heat conductive layer and the second conductive layer consist of different materials with the conductive layer.

8. The package base according to claim 1, wherein the porous insulating layer exposes the bottom surface.

9. A package base of a luminescent diode, comprising:
   a substrate having a first surface and a second surface opposite to the first surface;
   a holding space formed on the first surface and having a bottom surface for supporting the luminescent diode;
   a porous insulating ring extending from the bottom surface of the holding space to the second surface;
   a through hole formed in the porous insulating ring extending from the bottom surface of the holding space to the second surface; and
   a first heat conductive layer directly formed on the first surface for conducting heat generated by the luminescent diode to the substrate.

10. The package base according to claim 9, further comprising a second heat conductive layer directly formed on the second surface for conducting heat from the substrate outwards.

11. The package base according to claim 10, further comprising a conductive layer to be electrically connected to the luminescent diode, the conductive layer being arranged over the porous insulating layer.

12. The package base according to claim 11, wherein the first heat conductive layer and the second conductive layer consist of different materials with the conductive layer.

13. The package base according to claim 9, wherein the porous insulating layer exposes the bottom surface.

\* \* \* \* \*